United States Patent
Loubet et al.

(10) Patent No.: US 10,134,899 B2
(45) Date of Patent: Nov. 20, 2018

(54) FACET-FREE STRAINED SILICON TRANSISTOR

(71) Applicant: STMicroelectronics, Inc., Coppell, TX (US)

(72) Inventors: Nicolas Loubet, Guilderland, NY (US); Prasanna Khare, Schenectady, NY (US); Qing Liu, Irvine, CA (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 14/983,070

(22) Filed: Dec. 29, 2015

(65) Prior Publication Data

US 2016/0149038 A1    May 26, 2016

Related U.S. Application Data

(62) Division of application No. 13/692,632, filed on Dec. 3, 2012.

(51) Int. Cl.
*H01L 29/78* (2006.01)
*H01L 29/06* (2006.01)
(Continued)

(52) U.S. Cl.
CPC .... *H01L 29/7848* (2013.01); *H01L 21/76224* (2013.01); *H01L 21/823814* (2013.01);
(Continued)

(58) Field of Classification Search
CPC ..... H01L 21/823814; H01L 21/823878; H01L 29/6656; H01L 29/7848; H01L 21/3065;
(Continued)

(56) References Cited

U.S. PATENT DOCUMENTS 6,287,913 B1 * 9/2001 Agnello .......... H01L 21/823443
257/E21.622
6,689,665 B1    2/2004 Jang et al.
(Continued)

FOREIGN PATENT DOCUMENTS

CN    102623487 A    8/2012

OTHER PUBLICATIONS

Chinese Search Report dated Jan. 4, 2016, for CN Application No. 2013401707750, 2 pages.

*Primary Examiner* — Matthew Landau
*Assistant Examiner* — Mark Hatzilambrou
(74) *Attorney, Agent, or Firm* — Seed Intellectual Property Law Group LLP

(57) ABSTRACT

The presence of a facet or a void in an epitaxially grown crystal indicates that crystal growth has been interrupted by defects or by certain material boundaries. Faceting can be suppressed during epitaxial growth of silicon compounds that form source and drain regions of strained silicon transistors. It has been observed that faceting can occur when epitaxial layers of certain silicon compounds are grown adjacent to an oxide boundary, but faceting does not occur when the epitaxial layer is grown adjacent to a silicon boundary or adjacent to a nitride boundary. Because epitaxial growth of silicon compounds is often necessary in the vicinity of isolation trenches that are filled with oxide, techniques for suppression of faceting in these areas are of particular interest. One such technique, presented herein, is to line the isolation trenches with SiN to provide a barrier between the oxide and the region in which epitaxial growth is intended.

20 Claims, 9 Drawing Sheets

(51) Int. Cl.
*H01L 29/66* (2006.01)
*H01L 29/165* (2006.01)
*H01L 21/762* (2006.01)
*H01L 21/8238* (2006.01)
*H01L 29/16* (2006.01)
*H01L 29/161* (2006.01)

(52) U.S. Cl.
CPC ........ *H01L 21/823842* (2013.01); *H01L 21/823864* (2013.01); *H01L 21/823878* (2013.01); *H01L 29/06* (2013.01); *H01L 29/161* (2013.01); *H01L 29/165* (2013.01); *H01L 29/1608* (2013.01); *H01L 29/66628* (2013.01); *H01L 29/66636* (2013.01); *H01L 29/7834* (2013.01); *H01L 29/6656* (2013.01)

(58) Field of Classification Search
CPC ......... H01L 21/30655; H01L 21/31116; H01J 2237/3346
See application file for complete search history.

(56) References Cited

U.S. PATENT DOCUMENTS

| | | | |
|---|---|---|---|
| 7,670,934 B1 * | 3/2010 | Pal | H01L 21/823412 257/E21.09 |
| 8,216,904 B2 | 7/2012 | Dove | |
| 8,609,508 B2 | 12/2013 | Dove | |
| 2004/0164373 A1 | 8/2004 | Koester et al. | |
| 2005/0167778 A1 | 8/2005 | Kim et al. | |
| 2005/0212040 A1 | 9/2005 | Hokazono et al. | |
| 2005/0247986 A1 | 11/2005 | Ko et al. | |
| 2006/0214258 A1 | 9/2006 | Kiyotoshi | |
| 2006/0281253 A1 | 12/2006 | Yelehanka et al. | |
| 2007/0012913 A1 | 1/2007 | Ohta et al. | |
| 2007/0018205 A1 * | 1/2007 | Chidambarrao | H01L 21/823412 257/288 |
| 2007/0259500 A1 | 11/2007 | Cheng et al. | |
| 2008/0157200 A1 * | 7/2008 | Kim | H01L 29/66628 257/347 |
| 2008/0217703 A1 | 9/2008 | Mehta et al. | |
| 2008/0261361 A1 | 10/2008 | Loiko et al. | |
| 2009/0152634 A1 | 6/2009 | Grant | |
| 2009/0242995 A1 * | 10/2009 | Suzuki | H01L 21/823412 257/368 |
| 2009/0289279 A1 | 11/2009 | Khare | |
| 2011/0024840 A1 | 2/2011 | Khater | |
| 2012/0104503 A1 | 5/2012 | Mehrotra | |
| 2012/0119296 A1 | 5/2012 | Anderson et al. | |
| 2013/0037821 A1 | 2/2013 | Wang et al. | |
| 2013/0341754 A1 | 12/2013 | Doris et al. | |
| 2014/0054698 A1 | 2/2014 | Liu et al. | |

\* cited by examiner

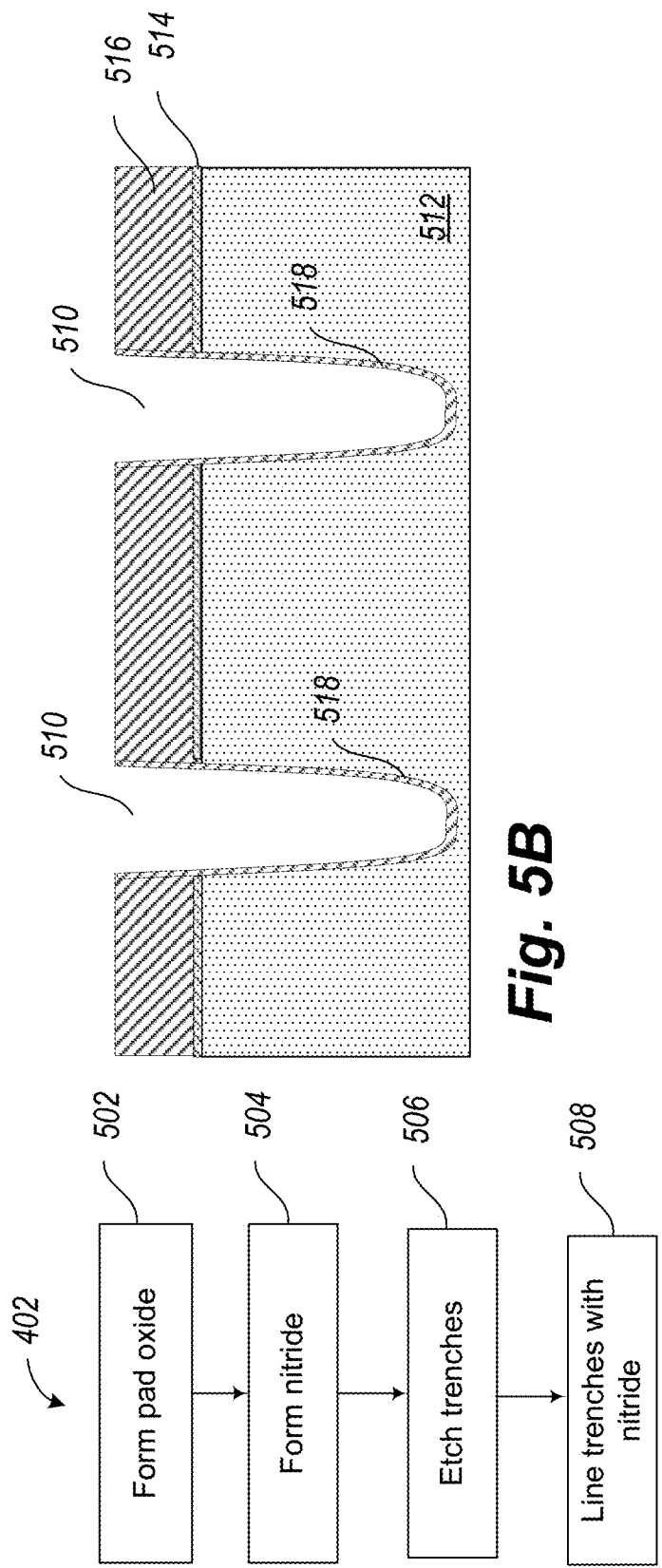

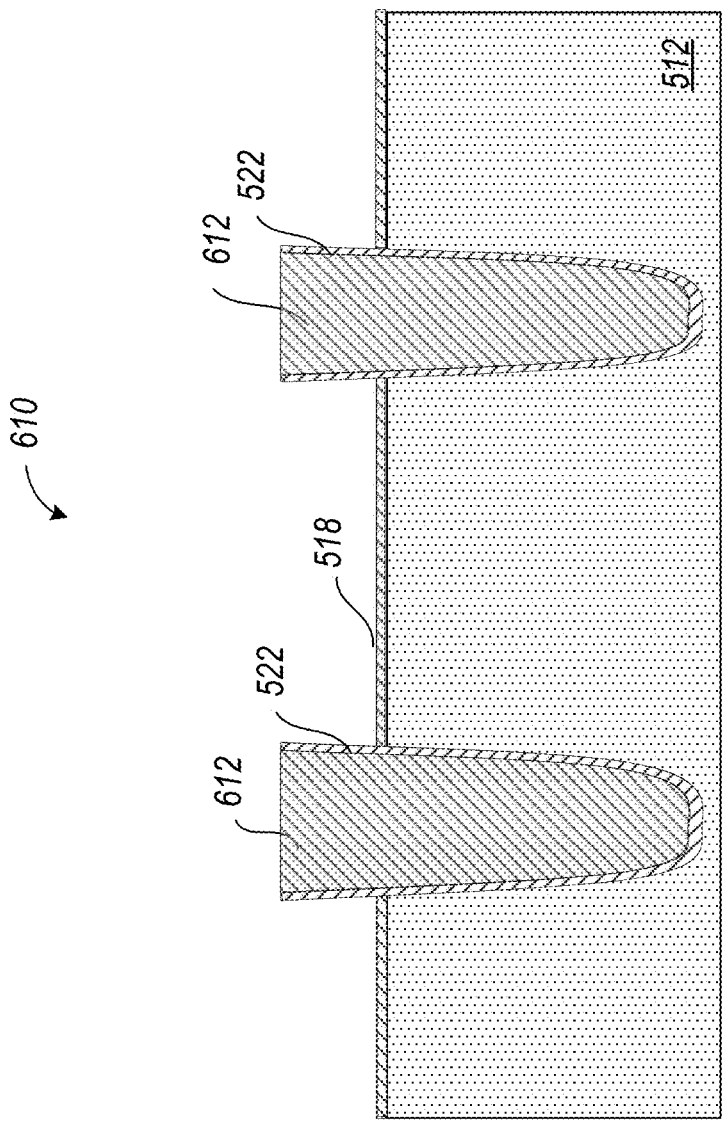
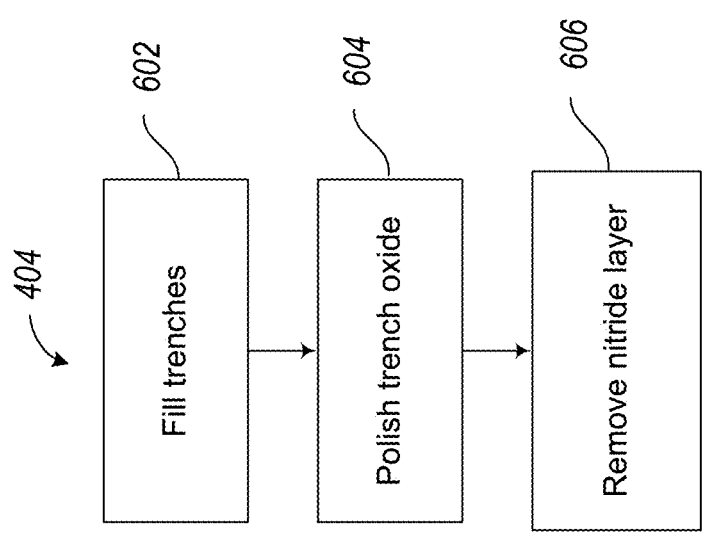
Fig. 6B
Fig. 6A

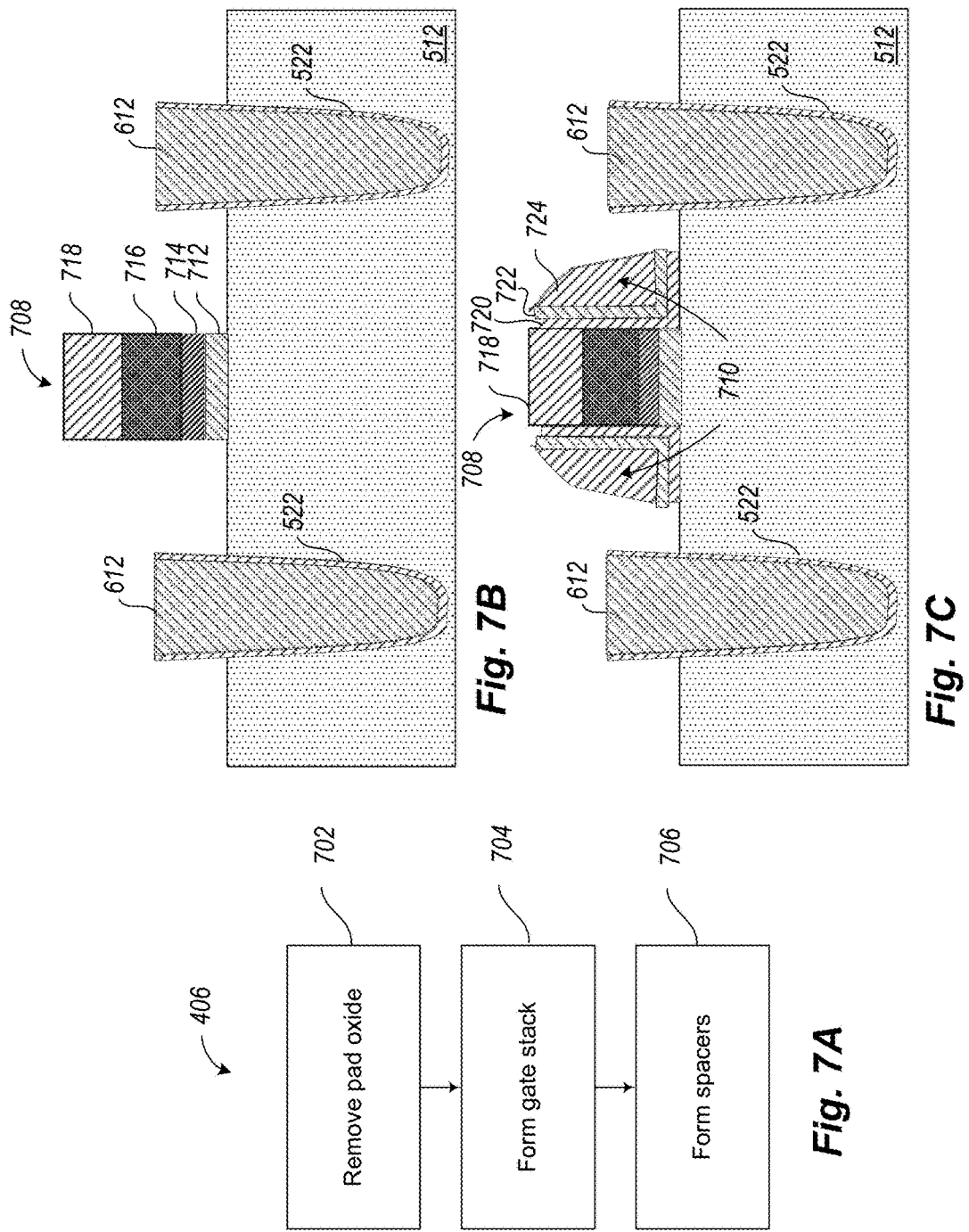

US 10,134,899 B2

FACET-FREE STRAINED SILICON TRANSISTOR

RELATED APPLICATION

This patent application is a divisional of U.S. patent application Ser. No. 13/692,632 filed Dec. 30, 2012, which application is hereby incorporated by reference in its entirety.

BACKGROUND

Technical Field

The present disclosure relates to the fabrication of integrated circuit MOSFET (Metal-Oxide-Semiconductor Field Effect Transistor) devices, and in particular, to strained silicon devices.

Description of the Related Art

Integrated circuits built on silicon substrates typically incorporate field effect transistors (FETs) in which current flows through a semiconducting channel between a source and a drain, in response to a voltage applied to a gate. Strained silicon transistors are MOSFET devices that introduce compressive strain into the silicon substrate to increase mobility of charge carriers in the semiconducting channel. Increasing the charge mobility results in a faster switching response to changes in voltage applied to the gate. One way to introduce strain is to replace bulk silicon in the source and drain regions, or in the channel itself, with an epitaxially-grown silicon compound.

Epitaxial growth refers to growth of a layer on the silicon surface that has a similar crystalline structure to that of the underlying bulk silicon. To prevent discontinuities at the boundary of the epitaxial layer, it is important to perform an "epi pre-clean" step to ensure that the crystalline surface is free of contaminants. The epitaxial source and drain regions can be doped as the epitaxial growth occurs, by introducing impurities in-situ during the epitaxy process step.

BRIEF SUMMARY

One problem that can occur during epitaxial growth of silicon or silicon compounds such as, for example, silicon germanium (SiGe) or silicon carbide (SiC) is faceting. The presence of a facet and/or a void in a region that should contain a fully grown crystal indicates that crystal growth has been interrupted by defects or by the presence of certain material boundaries.

In particular, it has been observed that faceting occurs when epitaxial layers of certain silicon compounds are grown adjacent to an oxide boundary (e.g., silicon dioxide ($SiO_2$), as shown in FIG. 1A), but faceting does not occur when the epitaxial layer is grown adjacent to a silicon boundary (as shown in FIG. 1B) or adjacent to a nitride boundary (e.g., silicon nitride (SiN)). Because epitaxial growth of silicon compounds is often necessary in the vicinity of isolation trenches that are filled with oxide, techniques for suppression of faceting are desirable. One such technique, presented herein, is to line the isolation trenches with SiN so that the SiN liner provides a barrier between the oxide and the region in which epitaxial growth is intended.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

FIG. 5A is a process flow diagram showing a sequence of process steps that can be used to form lined isolation trenches in a silicon substrate.

FIG. 5B is a side view of a device profile formed by the process flow shown in FIG. 5A.

FIG. 6A is a process flow diagram showing a further sequence of process steps that can be used to complete formation of trench isolation in a silicon substrate.

FIG. 6B is a side view of a device profile formed by the process flow shown in FIG. 6A.

FIG. 7A is a process flow diagram showing a further sequence of process steps that can be used to form a gate and nitride spacers for an exemplary transistor described herein.

FIGS. 7B and 7C are side views of facet-free device profiles formed by the process flow shown in FIG. 7A.

DETAILED DESCRIPTION

Figure 1B:
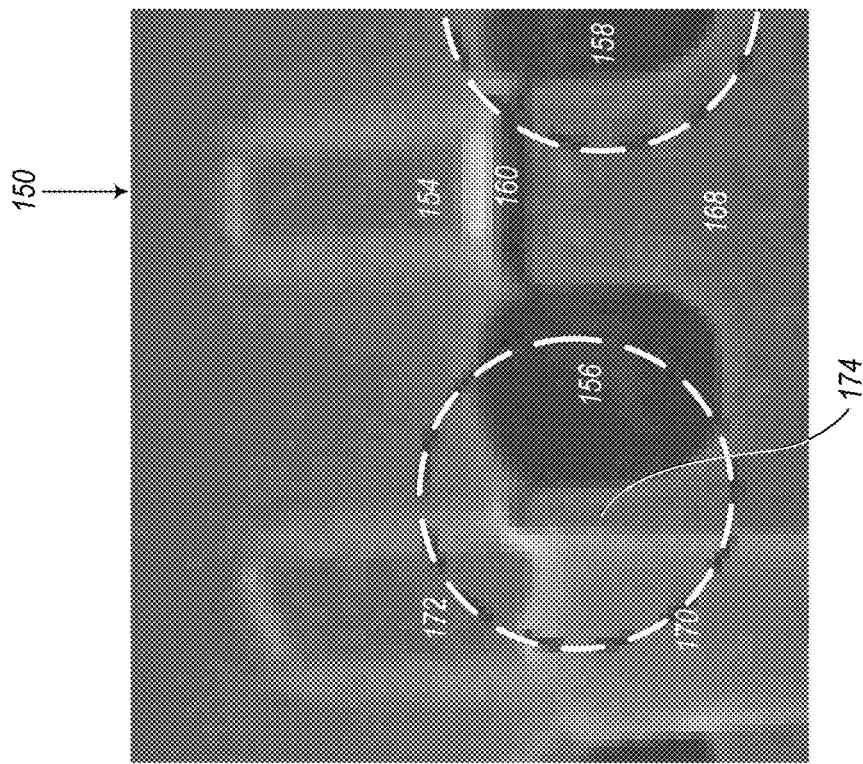
FIG. 1B is a side view, derived from an actual scanning electron microscope image, of a prior art epitaxial silicon compound in which faceting has been suppressed by maintaining a silicon barrier between the oxide boundary and the region in which epitaxial growth is intended.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to insulating materials or semiconducting materials can include various materials other than those used to illustrate specific embodiments of the transistor devices presented. The term "epitaxial silicon compounds" should not be construed narrowly to limit an epitaxially grown structure to Si or SiGe, for example, but rather, the term "epitaxial silicon compounds" is broadly construed to cover any compounds that can be grown epitaxially from a crystalline silicon surface.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating.

Reference throughout the specification to conventional etching techniques known in the art of semiconductor fabrication for selective removal of polysilicon, silicon nitride, silicon dioxide, metals, photoresist, polyimide, or similar materials include such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to examples of field effect transistor structures that have been produced; however, the present disclosure and the reference to certain materials, dimensions, and the details and ordering of processing steps are exemplary and should not be limited to those shown.

In the figures, identical reference numbers identify similar features or elements. The sizes and relative positions of the features in the figures are not necessarily drawn to scale.

Figure 1A:
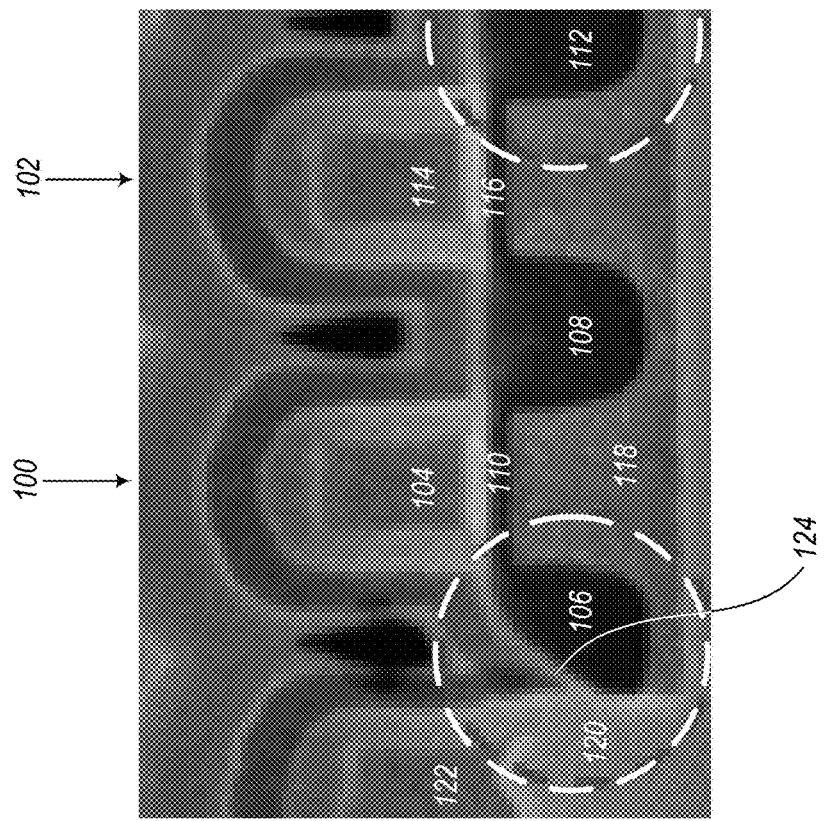
FIG. 1A is a side view, derived from an actual scanning electron microscope image, of a prior art epitaxial silicon compound that exhibits faceting near an oxide boundary.

FIGS. 1A and 1B present examples of faceting that has been observed to occur during SiGe or SiC epitaxy using existing fabrication techniques. FIG. 1A shows two prior art strained silicon field effect transistors 100 and 102, respectively. The transistor 100 includes a gate 104 overlying epitaxial source and drains, 106 and 108, respectively, connected by a semiconducting channel 110. The drain 108 serves as a source for the transistor 102, which includes a drain 112, a gate 114, and a semiconducting channel 116. The source/drain regions 106, 108, and 112 contain epitaxial SiGe that has been grown adjacent to a silicon substrate 118.

The transistor 100 is located next to an isolation trench 120 filled with an insulating material, e.g., silicon dioxide, as is well known in the art. A dummy gate 122 is located above the isolation trench 120. The source 106 exhibits faceting 124 where the epitaxial growth of the SiGe encounters the oxide material in the isolation trench 120. The source/drain region 108 does not border an oxide-filled isolation trench and does not exhibit faceting.

FIG. 1B shows a prior art strained silicon field effect transistor 150 that includes a gate 154 overlying a source region 156 and a drain region 158, connected by a semiconducting channel 160. The source/drain regions 156 and 158 contain epitaxial SiGe that has been grown adjacent to a silicon substrate 168. The transistor 150 is located next to an isolation trench 170 filled with an insulating material, e.g., silicon dioxide, similar to the transistor 100 shown in FIG. 1A. A dummy gate 172 is located above the isolation trench 170. However, unlike the transistor 100, the transistor 150 is spaced apart from the isolation trench 170 by a thin silicon barrier 174. The presence of the thin silicon barrier 174 suppresses formation of a facet during epitaxial growth of the SiGe in the source region 156 by separating the epitaxial growth from the oxide within the isolation trench 170.

Figure 2:
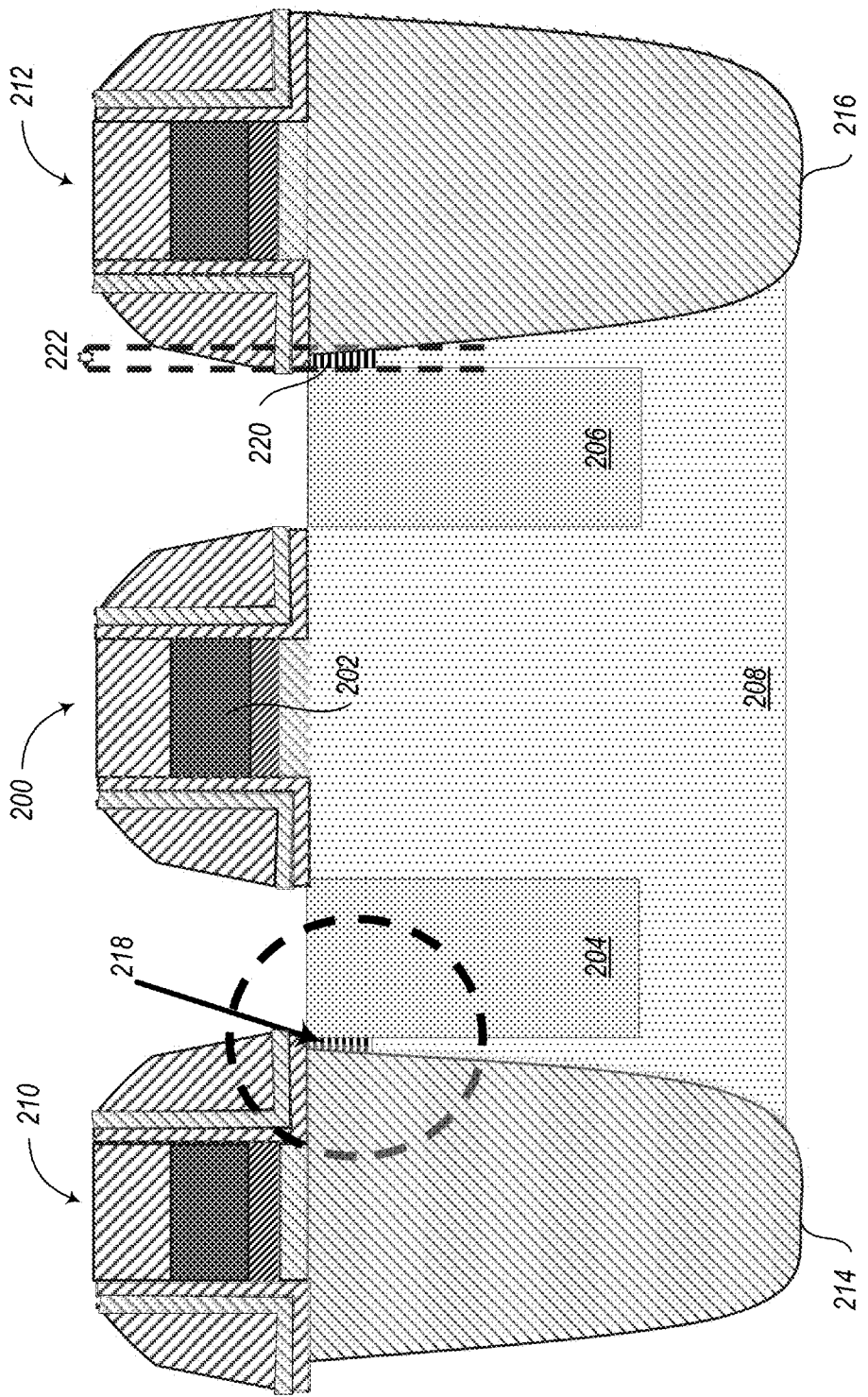
FIG. 2 illustrates a prior art technique for forming the silicon barrier shown in FIG. 1B, in which a sacrificial gate structure is used as a mask.

FIG. 2 illustrates one embodiment of a method of formation of the thin silicon barrier 174. FIG. 2 shows a strained silicon field effect transistor 200 including a gate 202 and epitaxial source and drain regions 204 and 206, respectively. The source/drain regions 204 and 206 are grown from a substrate 208. The transistor 200 is located between two dummy gates 210 and 212. The dummy gates 210 and 212 overlie isolation trenches 214 and 216, respectively. The dummy gates 210 and 212 can be used as masks for etching voids into the substrate 208, which are later filled in by epitaxial growth to form the source and drain regions 204 and 206, respectively.

A first thin silicon barrier 218 separates the isolation trench 214 from the source 204. The first thin silicon barrier 218 thus corresponds to the thin silicon barrier 174 shown in the cross-section micrograph in FIG. 1B. A second thin silicon barrier 220 separates the isolation trench 216 from the drain 206. Each of the thin silicon barriers 218 and 220 has a width that is defined by the corresponding dummy gate. For example, a barrier width of the first thin silicon barrier 218 is defined by the overlap distance that the dummy gate 210 extends beyond the edge of the isolation trench 214. Likewise, a barrier width 222 of the second thin silicon barrier 220 is defined by the distance that the dummy gate 212 extends beyond the edge of the isolation trench 216.

One drawback of using the thin silicon barriers 218 and 220 to suppress faceting during epitaxial growth of the SiGe source/drain regions 204 and 206 is a cumulative loss of real estate in an integrated circuit chip due to the barrier widths (e.g., 222). Even though each silicon barrier width 222 may only be about 10 nm, when millions of transistors are taken into account, an overall circuit density loss of about 10% may be associated with the silicon barrier approach.

Figure 3:
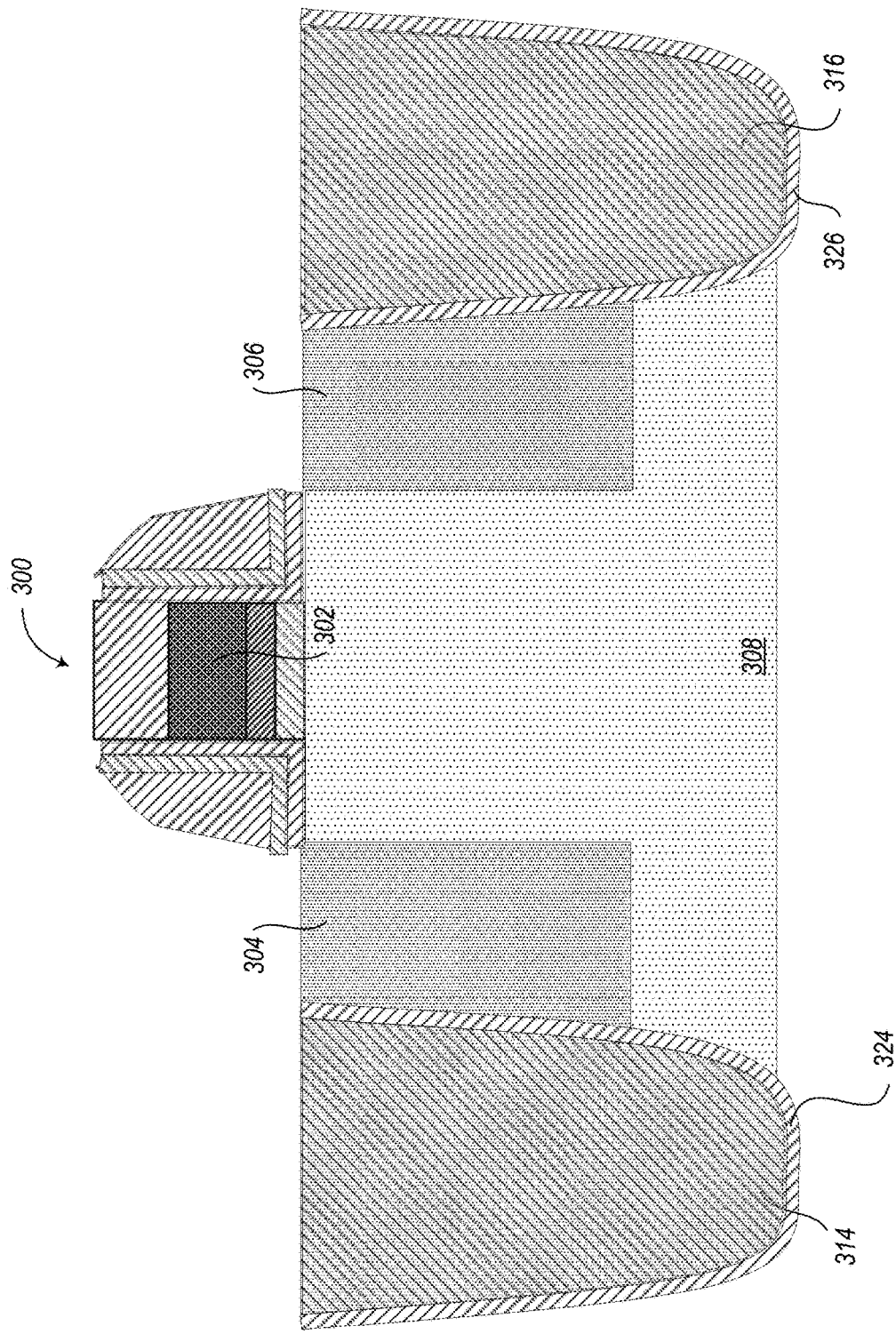
FIG. 3 is side view of a device profile that includes isolation trenches having nitride liners according to an embodiment described herein.

A simpler and more advantageous approach, as described herein, that does not incur a reduction in circuit density, is illustrated in FIG. 3. One embodiment of a strained silicon field effect transistor 300 includes a gate 302, a source 304, and a drain 306. The transistor 300 is formed in an active region of a substrate 308 demarcated by a pair of isolation trenches 314 and 316 that are at least partially embedded below the surface of the substrate and filled with oxide. Instead of silicon barriers 218 and 220 separating the source/drain regions 304 and 306 from the isolation trenches, silicon nitride liners 324 and 326 can be formed in the trenches 314 and 316, respectively, to establish nitride-silicon boundaries within the substrate, prior to depositing the oxide trench fill.

Figure 4:
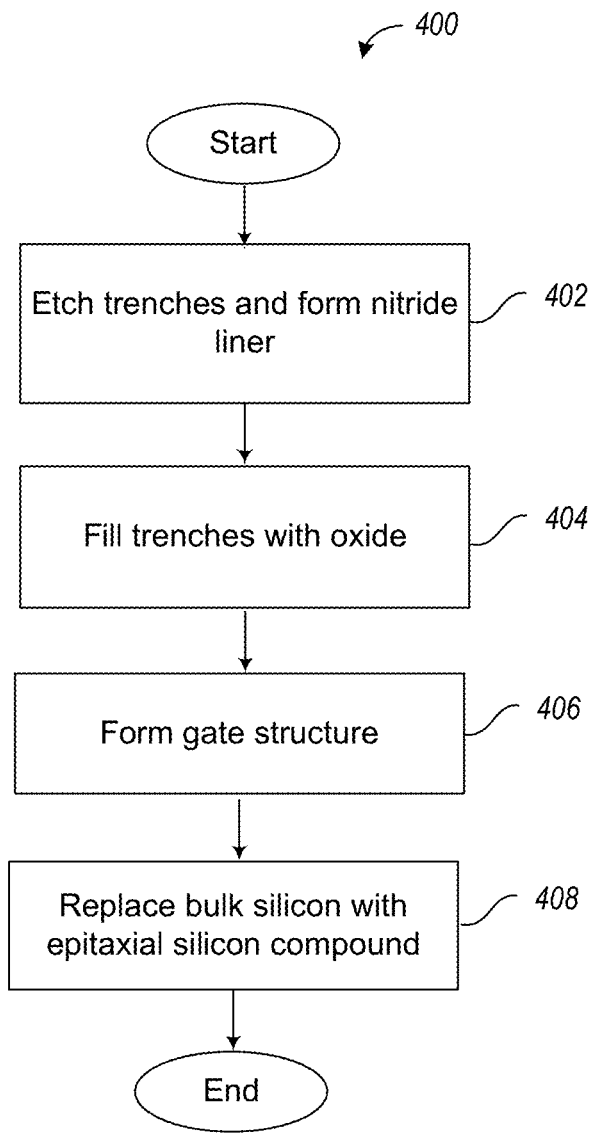
FIG. 4 is a high level flow diagram illustrating a process for fabricating a facet-free epitaxial source/drain transistor as described herein.

FIG. 4 presents a high-level process flow 400 that describes basic actions in a fabrication process that can be used to create the structures shown in FIG. 3. The steps shown in FIG. 4 are detailed further in FIGS. 5A-8C below. At 402, isolation trenches are etched in the silicon substrate and nitride liners are deposited. At 404, the isolation trenches are filled with oxide. At 406, gate structures are formed. At 408, bulk silicon is etched adjacent to the gate and replaced with an epitaxial silicon compound to form source and drain regions.

With reference to FIGS. 5A-8C below, each set of figures shows one of the process steps from FIG. 4 in more detail by presenting a more comprehensive sequence of process steps and a corresponding side view that results upon completion of that sequence of steps.

FIGS. 5A and 5B illustrate the step 402 in greater detail, in which isolation trenches are formed and lined with a conformal silicon nitride covering, in accordance with one embodiment. FIG. 5A shows a sequence of process steps including the steps 502, 504, 506, and 508 that can be carried out to form the lined isolation trenches 510 shown in FIG. 5B.

First, a blanket layer stack can be deposited onto a silicon substrate 512 using conventional deposition techniques, the stack including a pad oxide layer 514, on top of which is a nitride layer 516. The pad oxide layer 514 can be thermally grown or deposited at 502, as a thin layer of about 5-10 nm thickness, for example. At 504, the nitride layer 516 can be deposited with a thickness within the range of about 20 nm-50 nm. The pad oxide layer 514 mechanically isolates the nitride layer 516 from the silicon substrate 512 to provide strain relief so that stress in the nitride film is prevented from inducing cracks in the silicon substrate 512. The nitride layer 516 shown in FIG. 5B can be used as a hard mask for patterning isolation trenches in the underlying silicon substrate 512 using conventional photolithography and etching techniques.

Because conventional photolithography is well known to those skilled in the art of semiconductor processing, it is not explicitly shown in the figures, but will be described briefly. Conventional photolithography entails spinning on a photoresist, exposing portions of the photoresist to ultraviolet light through a patterned mask, and developing away the unexposed portions of the photoresist, thereby transferring the mask pattern to the photoresist. In the context of integrated circuit fabrication, each mask pattern contains an integrated circuit layout. The photoresist mask can then be used to etch the mask pattern into one or more underlying layers. Typically, use of such a photoresist mask is effective only if the subsequent etch is relatively shallow, because photoresist is likely to be consumed during the etch process. If the required etch process is deep, as is the case with the lined isolation trenches 510, a hard mask (e.g., the nitride layer 516) is typically used, which is more resistant to damage from a lengthy plasma (RIE) etch.

After etching the isolation trenches 510 at step 506, an additional silicon nitride deposition is performed at 508 to form a trench liner 518 of silicon nitride having a thickness in the range of about 3 nm-12 nm. The trench liner can be deposited, for example, using a high temperature process at a temperature of about 630 C.

FIGS. 6A and 6B illustrate the step 404 in greater detail, in which isolation trenches are filled and planarized in accordance with one embodiment. FIG. 6A shows a sequence of process steps including the steps 602, 604, and 606, that can be carried out to form the filled isolation trenches 610 shown in FIG. 6B.

At 602, the isolation trenches 510 can be filled with an insulating material. The insulator can be, for example, a silicon dioxide such as a high aspect ratio process (HARP™) fill material 612. Such a HARP™ fill material 612 can be deposited using a proprietary process that is executed on specialized chemical vapor deposition (CVD) equipment available from Applied Materials, Inc. of Santa Clara, Calif.

At 604, the HARP™ fill material 612 can be planarized using a CMP process that stops on the nitride layer 516.

At 606, the nitride layer 516 can be removed using a plasma (RIE) etch process instead of a conventional hot phosphoric nitride removal step, so as not to attack the silicon nitride isolation trench liner 522. After the nitride layer 516 is removed, the filled isolation trenches 612 may protrude above the silicon substrate 512 by an amount approximately equal to the thickness of the nitride layer 516.

FIGS. 7A, 7B, and 7C illustrate the step 406 in greater detail, in which a sequence of process steps including steps 702, 704, and 706, can be carried out in a conventional way to form a patterned gate stack 708 and multi-layer spacers 710 as shown in FIG. 7C.

At 702 the pad oxide layer 514 can be removed using a wet chemical etchant, e.g., hydrofluoric acid (HF), that attacks silicon dioxide, selective to the silicon substrate 512.

At 704, a gate stack can be deposited including a gate dielectric 712, a gate having a first gate layer 714 and a second gate layer 716, and a hard mask 718. Embodiments of the first and second gate layers 714 and 716, respectively, can include bulk gate materials such as work function metal alloys, for example, tantalum nitride (TaN), titanium nitride (TiN), or titanium aluminum (TiAl). A conventional metal deposition process can be used to deposit the gate layers 714 and 716, such as CVD, PVD, an electroplating process, or an electro-less plating process. Alternatively, a conventional polysilicon gate can be deposited as the first gate layer 714, and the second gate layer 716 can be a silicide such as nickel silicide. The gate dielectric can be made of silicon dioxide, oxynitride, or of another material such as hafnium oxide or another dielectric material that has a high dielectric constant of greater than about 4.0. The gate stack can then be patterned using a single conventional photolithography mask step and a multi-step RIE process.

At 706, the multi-layer spacers 710 can be formed by masking the isolation trenches and treating the area between the isolation trenches. The multi-layer spacers 710 can include a first nitride spacer layer 720, an oxide spacer layer 722, and a second nitride spacer layer 724. The first nitride spacer layer 720 can be formed, for example, by simply performing a conformal silicon nitride deposition step, in which the thickness of the first nitride spacer layer 720 is in the range of about 20 nm-50 nm. The thickness of the first nitride spacer layer 720 then adds to the thickness of the hard mask 718 on top of the patterned gate stack. The oxide spacer layer 722 and the second nitride spacer layer 724 can be formed together by performing sequential conformal depositions of oxide and nitride over the patterned gate stack 708, and then performing a multi-step anisotropic (downward-directed) etch to form the L-shaped multi-layer spacers 710 shown in FIG. 7C. In some embodiments, having a polysilicon gate, a thin oxide layer can be grown or deposited on the gate sidewalls before the first nitride spacer layer 720 is formed.

Figure 8B:
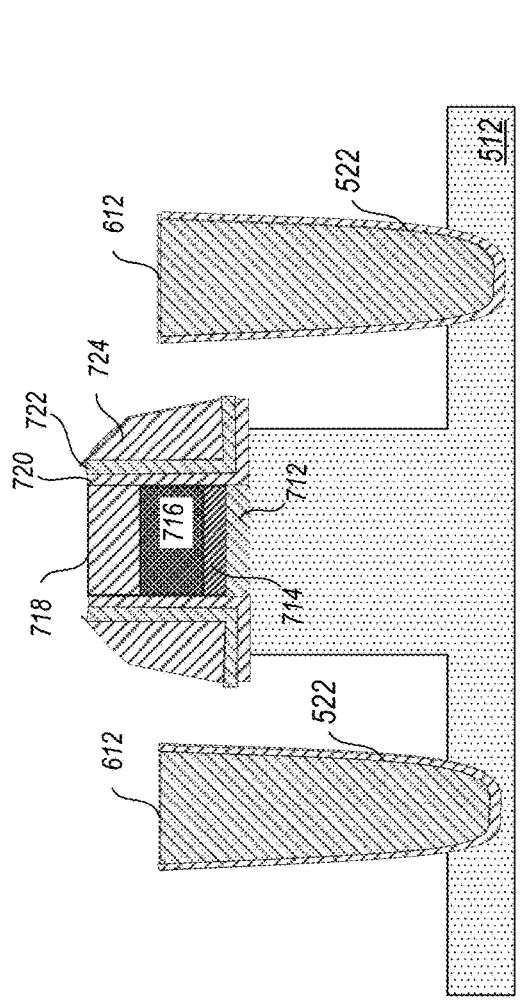
FIGS. 8B and 8C are side views of facet-free device profiles formed by the process flow shown in FIG. 8A.
Figure 8C:
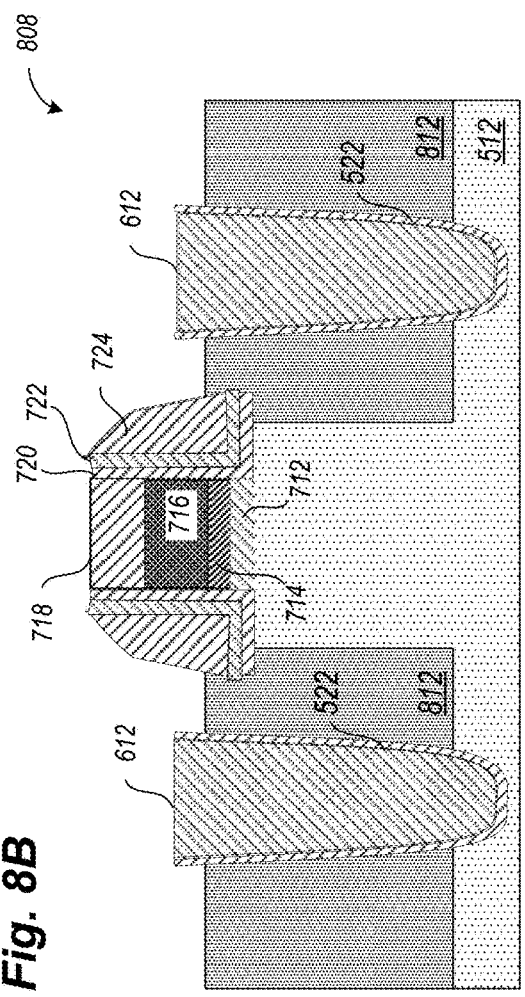
Figure 8A:
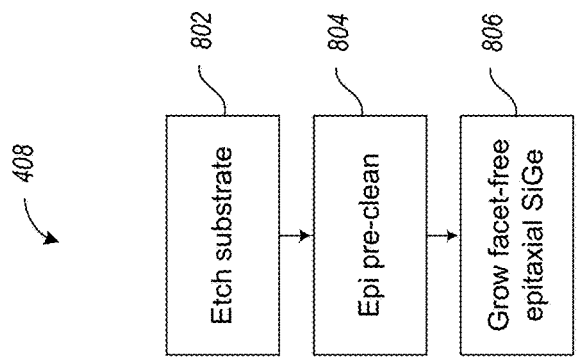
FIG. 8A is a process flow diagram showing a further sequence of process steps that can be used to complete formation of the facet-free epitaxial source/drain transistor described herein.

FIGS. 8A, 8B, and 8C illustrate the step 408 in greater detail, in which a sequence of process steps including the steps 802, 804, and 806 can be carried out to replace bulk silicon between the isolation trenches and the patterned gate stack 708 with an epitaxial silicon compound. The epitaxial silicon compound is thus substantially embedded in the silicon substrate 512. The resulting structure is a substantially facet-free epitaxial transistor 808 as shown in FIG. 8C.

At 802, the substrate 512 can be etched in the source/drain regions on either side of the filled isolation trenches to produce the structure shown in FIG. 8B, in which a timed wet or dry etch can be used in the absence of an etch stop layer. The gate structure including the patterned gate stack 708 and the multi-layer spacers 710 can be used as a hard mask while etching the substrate 512. A tendency of the nitride liner 522 to cause cracking in adjacent silicon can be mitigated by extending the silicon etch downward toward the bottom of the trenches.

An etch chemistry is desirably chosen that is highly selective to both oxide and nitride. Furthermore, the shape of the etch profiles and the degree of undercut can be crafted to adjust the performance characteristics of the device. The chemistry can be, for example, a plasma etch (RIE) chemistry that produces a substantially anisotropic (downward-directed) etch to create profiles that are substantially vertical. The substantially vertical profiles may have a small lateral undercut underneath the spacers such as the profiles shown in the embodiment of FIG. 8B. Alternatively, the profiles can be vertical with substantially no lateral undercut, such as those shown in the embodiment of FIG. 3. Alternatively, the isotropy of a multi-step etch process can be increased so that the profiles become rounded with a significant lateral undercut underneath the spacers and/or the gate itself such as the profiles 900 shown in the embodiment of FIG. 9A. In some embodiments, it may be advantageous for the shape of the top portions of the profiles (e.g., 910) to be rounded near the gate structure, through use of an isotropic etch, followed by an anisotropic etch that yields rectangular bottom portions 920 (FIG. 9B). Alternatively, if the nitride liner 522 is thin enough, the silicon etch profiles may be shallower as shown in FIG. 9C, without risk of inducing substrate cracks. In addition, the epitaxial source/drain regions can form a raised source/drain in which the height of the epitaxial layer 930 may coincide with the height of the trench isolation fill material 612 so that the isolation trenches are substantially flush with the final silicon surface instead of protruding above the silicon surface.

Figure 9A:
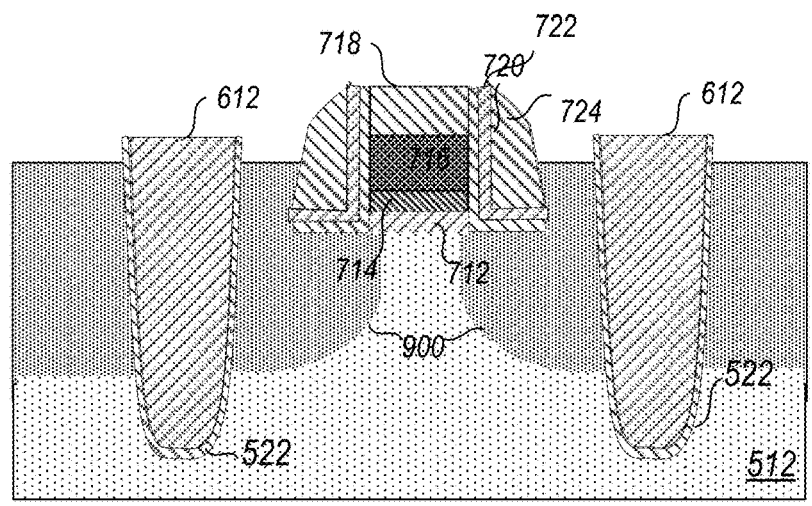
FIGS. 9A, 9B, and 9C are side views of alternative embodiments of facet-free device profiles as described herein.
Figure 9B:
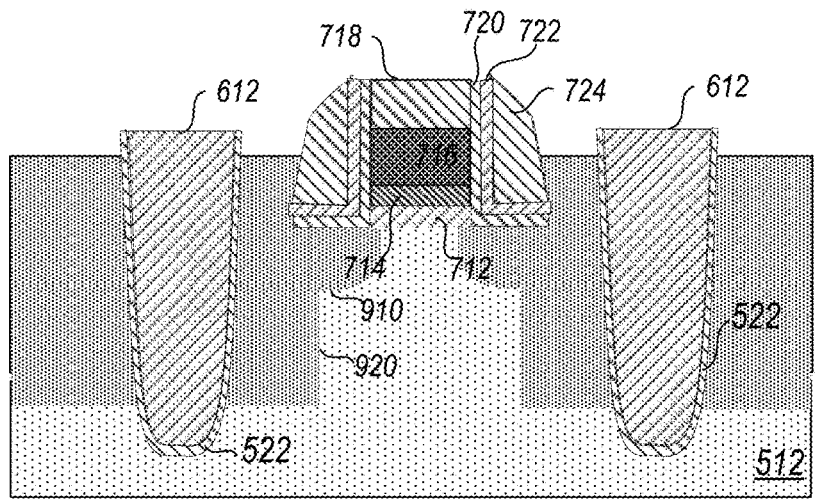
Figure 9C:
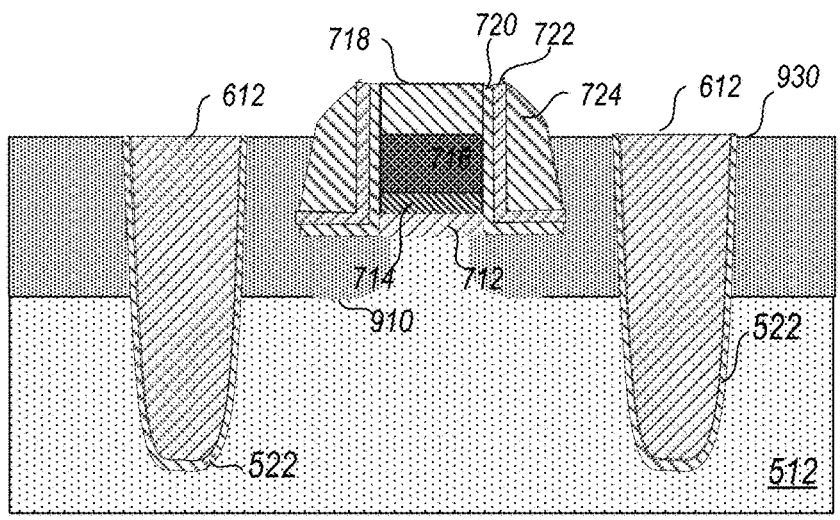

Alternatively, a wet chemical etch may proceed along crystal planes, resulting in a different sidewall profile, for example, a diamond-shaped profile (not shown) instead of the rectangular profiles shown in FIGS. 3 and 8B or the rounded profiles shown in FIGS. 9A, 9B, and 9C. At 804, a pre-clean can be performed to remove native oxide, impurities, and the like from the etched surface of the silicon substrate 512 to permit epitaxial crystal growth to occur unobstructed by surface contaminants. The pre-clean can be, for example, an HF dip or a silicon-cobalt-nickel (SiCoNi) pre-clean, similar to that which is known in the art as a pre-clean prior to nickel-silicide formation.

At 806, a crystalline epitaxial silicon compound 812 can be grown from the surface of the silicon substrate 512 to form the source and drain regions of the MOS device. The epitaxial silicon compound 812 can be, for example, SiGe in which the germanium content is desirably in the range of about 35%-55% to achieve a desired level of compressive strain to increase carrier mobility within the source and drain regions. Alternatively, the epitaxial silicon compound 812 can be SiC in which the carbon content is desirably less than about 5%. Or, other epitaxial silicon compounds 812 may be used to achieve desired device characteristics. If desired, in-situ doping can be accomplished by the introduction of impurities such as Boron or Phosphorous during the epitaxial growth. Because the silicon nitride isolation trench liner 522 is present, as the crystalline epitaxial silicon compound 812 grows, it will encounter nitride-silicon boundaries within the substrate 512 instead of oxide-silicon boundaries, and therefore the epitaxially-grown layer will remain substantially facet-free. The final thickness of the epitaxial silicon compound 812 is desirably such that its top surface is at or below the top surface of the filled isolation trenches 612.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a nitride layer on a first surface of a silicon substrate;
   forming a pair of isolation trenches that extend through the nitride layer and into the silicon substrate to a selected depth from the first surface;
   lining the isolation trenches with a conformal silicon nitride liner;
   filling the lined isolation trenches with an oxide;
   selectively removing the nitride layer by reactive ion etching while retaining the conformal silicon nitride liner, the conformal silicon nitride liner and the oxide extending above the first surface of the silicon substrate after removing the nitride layer;
   forming a gate structure on the surface of the silicon substrate between the pair of isolation trenches, the forming the gate structure including:

forming a bulk gate layer on the first surface of the silicon substrate;
forming a first nitride spacer layer on the first surface of the silicon substrate and abutting the bulk gate layer;
forming an oxide spacer layer on the first nitride spacer layer; and
forming a second nitride spacer layer on the oxide spacer layer, the oxide spacer layer extending further from the bulk gate layer in a direction parallel to the first surface of the silicon substrate than either of the first and second nitride spacer layers;
forming undercut regions by removing portions of the silicon substrate located between the isolation trenches, a portion of the gate structure extending over the undercut regions; and
forming substantially facet-free source and drain regions by growing an epitaxial silicon compound in the undercut regions, the source and drain regions in abutting contact with the conformal silicon nitride liners, the source and drain regions imparting strain to portions of the silicon substrate therebetween, planar side surfaces of the epitaxial silicon compound abutting the silicon substrate in the undercut regions, the planar side surfaces of the epitaxial silicon compound being transverse to the first surface of the silicon substrate.

2. The method of claim 1, wherein forming the bulk gate layer includes:
forming a gate dielectric on the first surface of the silicon substrate; and
forming a gate electrode on the gate dielectric.

3. The method of claim 2 wherein forming a gate electrode includes forming first and second gate layers.

4. The method of claim 3 wherein forming the first and second gate layers includes forming the first and second gate layers including one or more of a work function metal or a silicide material.

5. The method of claim 1 wherein forming undercut regions by removing portions of the silicon substrate further comprises etching the silicon substrate using an anisotropic reactive ion etch process.

6. The method of claim 5 wherein the anisotropic reactive ion etch process uses the gate structure as a mask.

7. The method of claim 1 wherein the epitaxial silicon compound includes silicon germanium having a germanium content within a range of about 35%-55%.

8. The method of claim 1 wherein the epitaxial silicon compound includes silicon carbide containing less than about 5% carbon.

9. The method of claim 1 wherein the epitaxial silicon compound is substantially embedded in the silicon substrate.

10. A method, comprising:
forming a nitride layer on a surface of a silicon substrate;
forming isolation trenches in the silicon substrate;
lining the isolation trenches with nitride barriers, each of the nitride barriers having a thickness in a range from 3 nm inclusive to 10 nm inclusive, the nitride barriers being in abutting contact with the silicon substrate;
forming oxide structures in the isolation trenches, each of the oxide structures being protected from contact with the silicon substrate by a respective nitride barrier, the oxide structures having an upper surface;
selectively removing the nitride layer by reactive ion etching while retaining the nitride barriers;
forming a gate structure on the surface of the silicon substrate, the forming the gate structure including:
forming a gate stack on the surface of the silicon substrate;
forming a first nitride spacer layer on the surface of the silicon substrate and abutting the gate stack, the first nitride spacer layer extending to a first distance from a side surface of the gate stack along a first direction transverse to the side surface of the gate stack;
forming an oxide spacer layer on the first nitride spacer layer, the oxide spacer layer extending to a second distance from the side surface of the gate stack along the first direction, the second distance being greater than the first distance; and
forming a second nitride spacer layer on the oxide spacer layer;
removing portions of the silicon substrate adjacent to the nitride barriers by etching in a selected direction to produce a selected profile shape, a portion of the gate structure extending over undercut regions formed by the removed portions of the silicon substrate; and
replacing the removed portions with an epitaxial silicon compound, the epitaxial silicon compound having an upper surface that is below the upper surface of the oxide structures in the isolation trenches, planar side surfaces of the epitaxial silicon compound abutting the silicon substrate in the undercut regions, the planar side surfaces of the epitaxial silicon compound being transverse to the surface of the silicon substrate, and the epitaxial silicon compound abuts side surfaces of the gate structure.

11. The method of claim 10 wherein the oxide structures are at least partially embedded in the silicon substrate.

12. The method of claim 10 wherein the nitride barriers conform to surfaces of the oxide structures.

13. The method of claim 10 wherein a thickness of the nitride barriers is substantially less than a thickness of the oxide structures.

14. The method of claim 10 wherein forming the gate structure includes forming the gate structure between the oxide structures, the gate structure together with the replaced portions being operable as a strained silicon transistor.

15. The method of claim 10 wherein removing portions of the silicon substrate includes etching anisotropically to produce straight profiles.

16. The method of claim 10 wherein removing portions of the silicon substrate includes etching isotropically to produce rounded profiles.

17. The method of claim 10 wherein removing portions of the silicon substrate includes etching isotropically followed by etching in a downward direction to produce a combined profile having rounded portions and straight portions.

18. The method of claim 10 wherein forming the second nitride spacer layer includes forming the second nitride spacer layer extending to a third distance from the side surface of the gate stack along the first direction, the third distance being less than the second distance.

19. A method, comprising:
forming a nitride layer on a surface of a silicon substrate;
forming isolation trenches in the silicon substrate;
lining the isolation trenches with nitride barriers, at least a portion of the nitride barriers being in abutting contact with, and surrounded by, the silicon substrate;
forming oxide structures in the isolation trenches, each of the oxide structures being protected from contact with the silicon substrate by a respective nitride barrier;
selectively removing the nitride layer by reactive ion etching while retaining the nitride barriers;
removing portions of the silicon substrate adjacent to the nitride barriers by etching in a selected direction to produce a selected profile shape;

replacing the removed portions of the silicon substrate with an epitaxial silicon compound, sidewalls of the nitride barriers being in abutting contact with the epitaxial silicon compound; and forming a gate between the oxide structures, by depositing a gate stack on the surface of the silicon substrate;

patterning the gate stack;

forming a first nitride spacer layer on the surface of the silicon substrate and abutting a side surface of the gate stack, the first nitride spacer layer extending to a first distance from the side surface of the gate stack along a first direction transverse to the side surface of the gate stack;

forming an oxide spacer layer on the first nitride spacer layer, the oxide spacer layer extending to a second distance from the side surface of the gate stack along the first direction, the second distance being greater than the first distance; and forming a second nitride spacer layer on the oxide spacer layer, wherein a portion of the gate extends over an undercut region in which a planar side surface of the epitaxial silicon compound abuts the silicon substrate, the planar side surface of the epitaxial silicon compound being transverse to the surface of the silicon substrate.

20. The method of claim 19 wherein forming the second nitride spacer layer includes forming the second nitride spacer layer extending to a third distance from the side surface of the gate stack along the first direction, the third distance being less than the second distance.

* * * * *